United States Patent [19]
Haaland

[11] Patent Number: 5,736,195
[45] Date of Patent: *Apr. 7, 1998

[54] METHOD OF COATING A THIN FILM ON A SUBSTRATE

[75] Inventor: Peter D. Haaland, Centerville, Ohio

[73] Assignee: Mobium Enterprises Corporation, Louisville, Colo.

[*] Notice: The term of this patent shall not extend beyond the expiration date of Pat. No. 5,403,617.

[21] Appl. No.: 415,637

[22] Filed: Apr. 3, 1995

Related U.S. Application Data

[63] Continuation-in-part of Ser. No. 121,726, Sep. 15, 1993, Pat. No. 5,403,647.

[51] Int. Cl.⁶ .................................. B05D 1/12; B05D 1/08
[52] U.S. Cl. .................... 427/180; 427/348; 427/421; 427/600; 118/323; 118/300; 239/8; 239/99; 239/102.2
[58] Field of Search ............................ 427/180, 348, 427/248.1, 421, 600; 118/300, 323; 239/8, 11, 99, 101, 102.2, 434, 434.5

[56] References Cited

U.S. PATENT DOCUMENTS

| | | | |
|---|---|---|---|
| 3,739,393 | 6/1973 | Lyon et al. | 346/1 |
| 3,840,391 | 10/1974 | Spitz et al. | 117/106 |
| 3,868,698 | 2/1975 | Dressler | 346/75 |
| 4,019,188 | 4/1977 | Hochberg et al. | 346/75 |
| 4,290,384 | 9/1981 | Ausschnitt et al. | 118/772 |
| 4,407,450 | 10/1983 | Chegolya et al. | 239/8 |
| 4,462,760 | 7/1984 | Sarich et al. | 417/54 |
| 4,659,013 | 4/1987 | Ledebuhr et al. | 239/8 |
| 4,765,540 | 8/1988 | Yie | 239/8 |
| 4,970,985 | 11/1990 | Slautterback | 118/300 |
| 4,996,080 | 2/1991 | Daraktchiev | 427/57 |
| 5,114,748 | 5/1992 | Tada et al. | 427/180 |
| 5,150,836 | 9/1992 | McKay et al. | 239/5 |
| 5,166,000 | 11/1992 | Singh et al. | 428/428 |
| 5,403,617 | 4/1995 | Haaland | 427/180 |

OTHER PUBLICATIONS

G. Switzer, "A Versatile System for Stable Generation of Uniform Droplets", Review of Scientific Instruments (1991).

Primary Examiner—Shrive Beck
Assistant Examiner—Brian K. Talbot
Attorney, Agent, or Firm—Thompson Hine & Flory LLP

[57] ABSTRACT

A method for coating a substrate with a relatively thin, uniform film of a fluid with a minimum of waste. A volume of fluid is produced and the size and velocity of the volume of fluid are selected such that the volumes of fluid break up upon impact with the substrate without splashing or rippling. The apparatus and method are ideal for coating semiconductor wafers with a photoresist solution. The kinetic energy of the volume of fluid is adjusted to overcome the free energy associated with surface tension on impact. The collision of the fluid thus results in a uniform, thin coating of photoresist or other coating solution which may then be further processed by conventional techniques.

18 Claims, 2 Drawing Sheets

5,736,195

METHOD OF COATING A THIN FILM ON A SUBSTRATE

This is a continuation-in-part of U.S. application Ser. No. 08/121,726, filed Sep. 15, 1993, now U.S. Pat. No. 5,403,647.

BACKGROUND

The present invention relates to processes for coating surfaces with thin layers of a liquid, solution, or suspension and, more particularly, the fabrication of uniform layers of polymer such as photoresist for lithography of semiconductor and other electronic materials.

Lithography of semiconductor materials such as silicon or gallium arsenide wafers requires the application of a uniform, thin (typically less than $10^{-5}$ meter) layer of photoresist which is subsequently exposed to light through a mask followed by selective etching of either the exposed or unexposed material in a liquid bath or plasma. In order to obtain high resolution patterns, the photoresist must be less than 10 microns thick with minimal variation of thickness over the entire wafer.

A typical process employs spin-coating, in which a puddle or mist of liquid polymer solution is deposited onto a substrate, after which the substrate is spun at high speed (typically 1000–3000 rpm) so that shear forces lead to a uniform and thin film. An example of such a process is shown in Daraktchiev U.S. Pat. No. 4,996,080, which discloses a coating process in which a liquid photoresist composition is atomized, and the atomized spray droplets are permitted to settle by gravity onto a substrate surface, which is spun at between 500 and 6000 rpm. The spinning step may occur either simultaneously with the deposition of the atomized droplets, or subsequent to the deposition.

However, an inherent disadvantage with such coating processes is that it can waste as much as 95% or more of the photoresist solution deposited on the substrate, which cannot be recycled. Further, such spin-coating processes typically do not work well on substrates which are not circular, not flat, or are larger than a few tens of centimeters in diameter. When such spin coating techniques are used on such non-uniform substrates, voids, pin holes and irregular thicknesses are formed. Accordingly, there is a need for an apparatus and process for coating solid surfaces with thin layers of a liquid, solution or suspension which minimizes the amount of coating material wasted, and which can be employed satisfactorily on surfaces which are not circular, flat or smaller than a few tens of centimeters in diameter.

SUMMARY

The present invention is a method for depositing a continuous, thin, uniform film of material, in particular a liquid-borne polymer such as photoresist, on a substrate in which a larger fraction of the deposited material is utilized than in prior art processes, and which can apply uniform coatings of film on relatively large, irregular and eccentric substrates. Typical substrates include glass panels or silicon wafers.

The invention presents a method whereby volumes of fluid coating material of arbitrary shape may be directed at a substrate in such a way that the volumes break up on impact without splashing or rippling. The method of the present invention is capable of casting a continuous coating of liquid on a substrate by accelerating a liquid volume toward a substrate such that the velocity, volume, and surface area of the liquid volume comply with the ratio shown in equation (1) below. It has been determined that a deviation from the ratio of equation (1) results in the liquid volume splashing or rippling when impacting the substrate, or forming inhomogeneities such as pin holes or voids.

Any volume of liquid may be used which satisfies the following general inequality:

$$\frac{\rho v^2 V}{2\sigma A} \geq 1 \qquad (1)$$

wherein:

v is the fluid velocity at impact $\rho$ is the fluid density

V is the fluid volume $\sigma$ is the surface tension

A is the fluid surface area

The method of the present invention includes the use of a pressurized gas to accelerate the generated volume of fluid toward the substrate, in contrast to prior art methods which rely on gravity to propel the liquid volumes to impact. The apparatus used to generate the volume of fluid preferably is a fluid droplet or stream generator which includes orifices of predetermined shape and a control for regulating the fluid flow. Orifices of the fluid generator may be elliptical, rectangular, round or irregular. The generator produces jets of fluid or discrete volumes of fluid of uniform size at a predetermined rate. Pressurized gas is released from the generator or auxiliary source which contacts and propels the volumes of fluid towards the target substrate.

The advantages of the method of the invention are that the rate of formation and the velocity of the volume of fluid can be controlled with high precision. Consequently, kinetic energy is imparted to the volume of fluid which is sufficient to overcome the cohesive surface tension forces holding the volume of fluid together so that the fluid spreads and "wets" the surface of the substrate upon impact, but this level of energy is below the level which would cause splashing or rippling in the layer of deposited film.

In another embodiment of the invention, the generator includes a plurality of orifices, so that an array is formed. Using such a device in the method of the invention, one is capable of coating large areas quickly and efficiently.

Accordingly, it is an object of the present invention to provide a method for depositing a uniform, thin film on a substrate without splashing or rippling; a method for depositing a thin film on a substrate in which the amount of material wasted in the coating process is minimized; a method for coating a substrate in which the quality of the film coating remains high even when the coating is applied to uneven, eccentric or relatively large substrates; a method for coating a substrate in which volumes of coating material of arbitrary shape and velocity can be controlled with high precision; and a method for coating a substrate in which the coating mechanism may comprise an array which can coat large areas evenly and rapidly.

Other objects and advantages of the present invention will be apparent from the following description, the accompanying drawings and the appended claims.

DETAILED DESCRIPTION

The physics of a single bristle will be described first, after which the use of a one or two dimensional array of bristles for coating large areas efficiently will be described.

Figure 1:
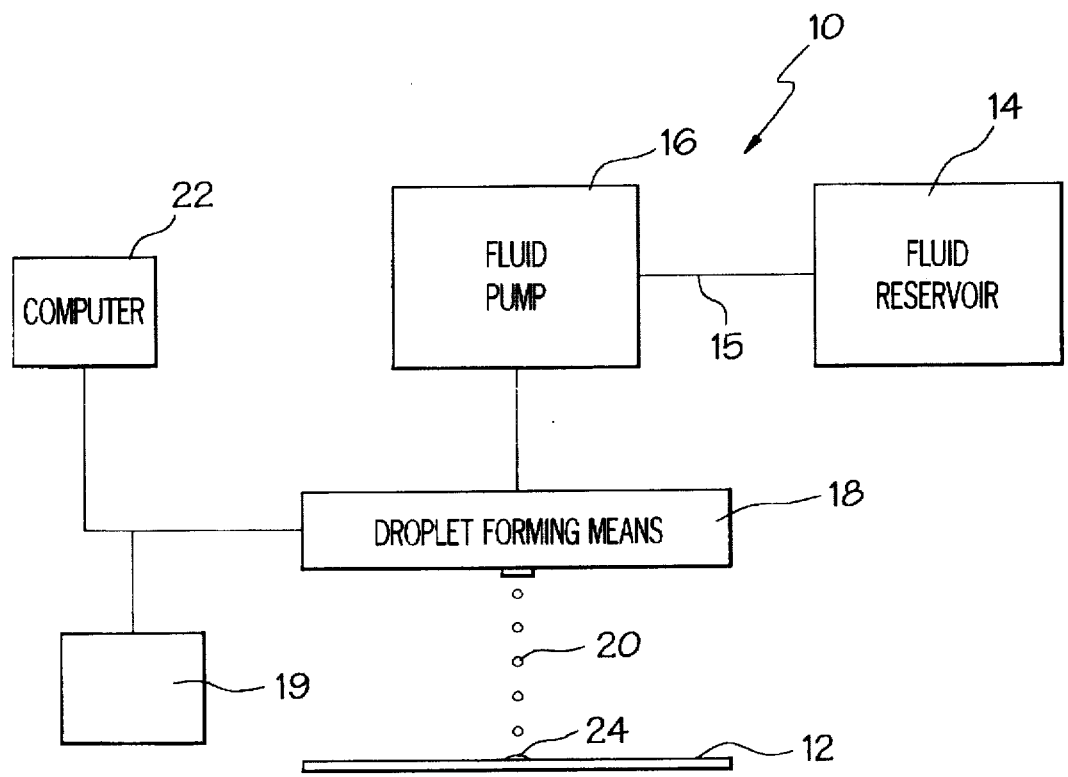
FIG. 1 is a schematic diagram of a preferred embodiment of the coating method of the present invention.
Figure 6:
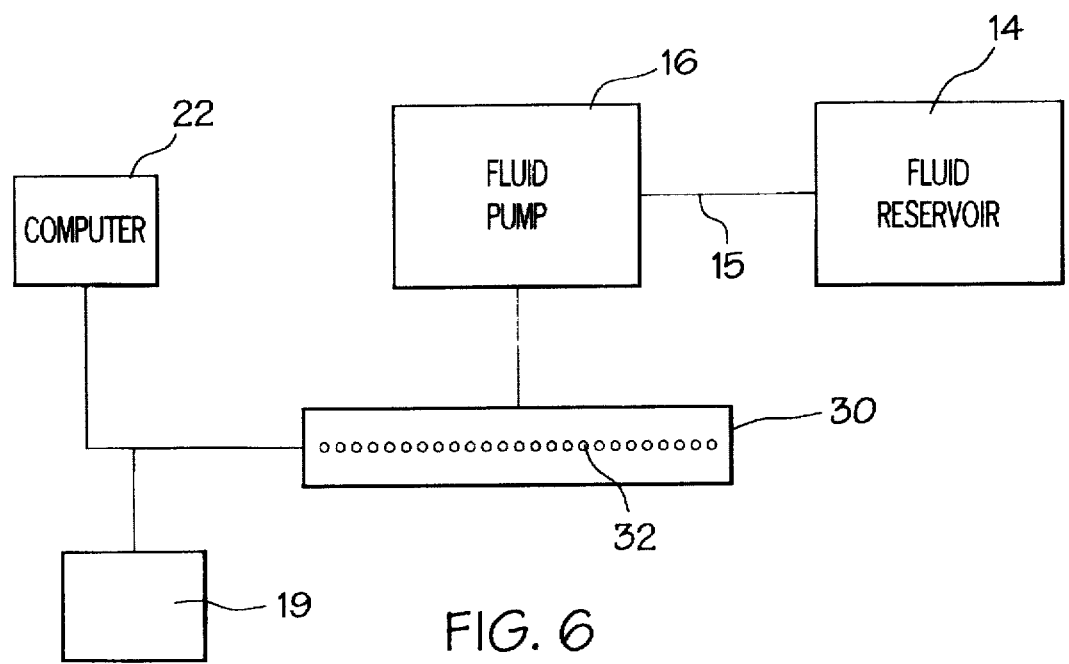
FIG. 6 is a schematic diagram of an alternate embodiment of the invention in which the coating component is an in the form of an array.

As shown in FIG. 1, the apparatus of the present invention, generally designated 10, is used to coat a substrate 12 with a film of a solution. The solution may be a liquid precursor, solution or suspension, such as photoresist, and is contained in a fluid reservoir 14. The reservoir 14 is connected by a liquid supply line 15 to a droplet forming means 18. "Droplet forming means" is intended to include a slit, orifice or orifice array which generates any predetermined shaped volume of fluid such as the droplet generator shown and described in G. Switzer, "A versatile system for stable generation of uniform droplets," Reviews of Scientific Instruments, pp. 2765-71 (1991), the disclosure of which is incorporated herein by reference. Alternately, a thermal ink jet or electrospray droplet source may be employed without departing from the scope of the invention, so long as the distributions of volume sizes and velocities of droplets are narrow.

Figure 2A:
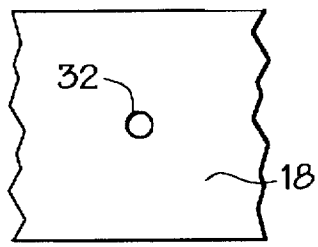
FIGS. 2A, 2B, 2C, 2D, 2E and 2F are typical orifice shapes which can be used in the invention of FIG. 1.
Figure 2B:
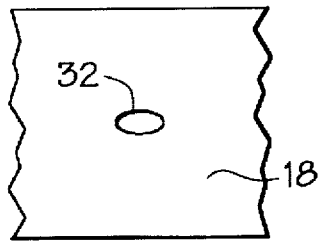
Figure 2C:
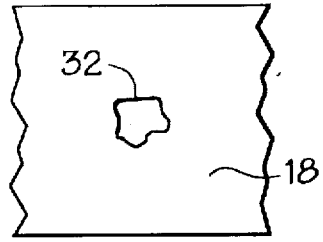
Figure 2D:
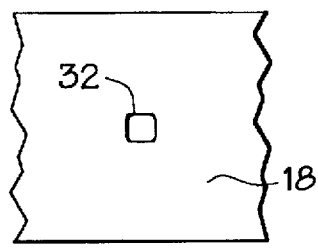
Figure 2E:
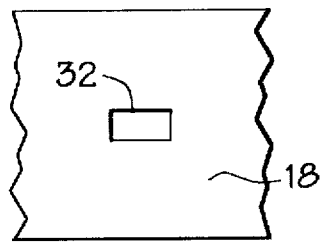
Figure 2F:
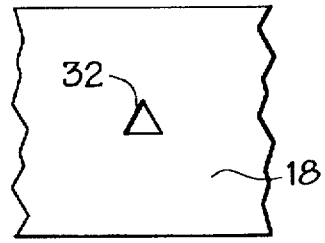

Volumes of fluid of desired shape are formed by pumping the fluid at predetermined pressure through the orifices. Exemplary shapes for the orifices include circular, as shown in FIG. 2A; elliptical, as shown in FIG. 2B; arbitrary or irregularly shaped, as shown in FIG. 2C; a rounded square, as shown in FIG. 2D; rectangular as shown in FIG. 2E; triangular, as shown in FIG. 2F or any other suitable shape. These shapes will influence the ratio of the droplet volume to the surface area of the extruded volumes of fluid droplets used for the coating of the substrate. The resultant shapes of the volumes of fluid generated from these orifices are continuous cylindrical jets, discontinuous cylindrical jets, spherical droplets or blobs. Alternatively, the shaped volume of fluid may be altered by regulating the rate of fluid flow. The shape and velocity of the emerging drops or cylindrical jets of fluid are determined by the properties of the fluid (viscosity, density, and surface tension), as well as by the shape of the orifices and the timing and pressure programmed by the fluid pump.

The volume of fluid is accelerated towards the substrate by air pressure. This can be accomplished by any means of auxiliary excitation 19 including sonic, electrostatic, gas dynamic or a hybrid valve technique described in U.S. Pat. No. 5,403,617 as long as the volume of fluid can move fast enough to satisfy inequality equation (1). Pressure may be supplied from behind the orifices in the plenum of the generator or from outside sources. This pressure will eventually drive the break-up of the continuous jet of fluid upon reaching the substrate.

An example of auxiliary excitation by sonic means can be found in U.S. Pat. No. 3,739,393 or 3,868,698, both to Lyon et al. Electrostatic excitation is shown in U.S. Pat. No. 4,019,188 to Hochberg et al.; U.S. Pat. No. 4,407,450 to Chegolya et al.; U.S. Pat. No. 4,765,540 to Yie; or U.S. Pat. No. 5,150,836 to McKay et al.

The generator and the pressurized gas from the excitation 19 are actuated by a computer control 22, which synchronizes the production of particles and gas from the valve allowing the formation of droplets, blobs, continuous jets or discontinuous jets of fluid.

The proximity of the substrate to the fluid generator also effects the shape of the volume of fluid. At large distances or long times after emergence from the orifice, all volumes of fluid will generally relax to substantially spherical shapes. Alternatively, gas flow around a spherical drop can also alter its shape away from spherical, as in a raindrop or a controlled gas flow driven against a droplet or stream. In the present invention, the pressure behind the orifice and/or that of the auxiliary excitation should be well defined so that the velocity of the fluid streams are controlled. The pressure can be turned on and off in order to achieve cylindrical streams of fluid of differing lengths as shown in FIGS. 3B, 4B, and 5B.

Figure 3A:
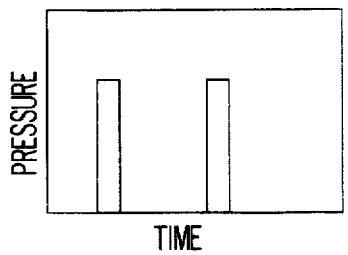
FIGS. 3A and 3B illustrate the time/pressure influence on the fluid geometry of two short cylindrical volumes.
Figure 4A:
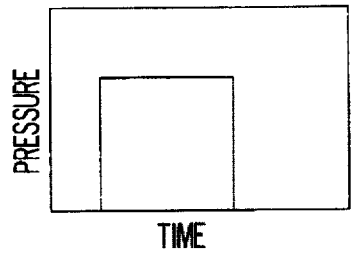
FIGS. 4A and 4B illustrate the time/pressure influence on the fluid geometry of an intermediate cylindrical volume.
Figure 5A:
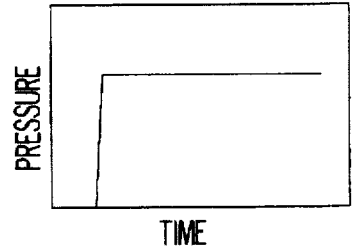
FIGS. 5A and 5B illustrate the time/pressure influence on the fluid geometry of a continuous volume of fluid.
Figure 3B:
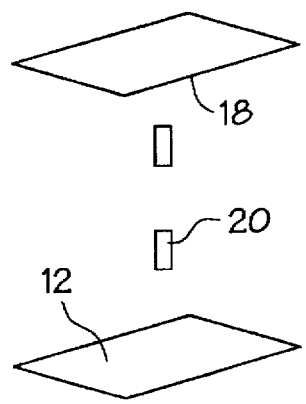
Figure 4B:
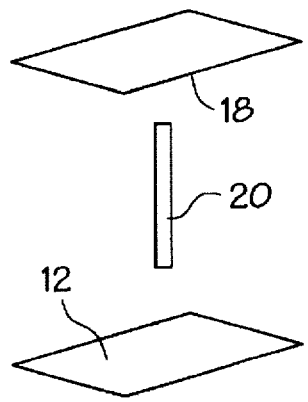
Figure 5B:
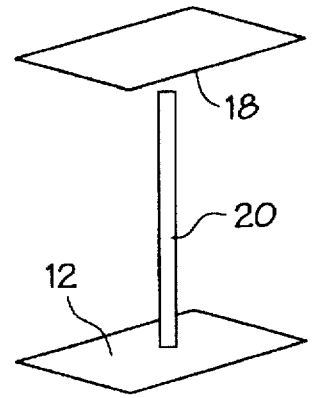

FIGS. 3A, 4A and 5A illustrate the influence of the timing and the pressure of the fluid pump on the geometry of the volume of fluid, and thereby the critical surface area to volume ratio. FIG. 3B shows two short pulses producing two short cylindrical jets accelerated towards the substrate 12. FIG. 4B shows one intermediate pulse generating an intermediate length cylindrical jet. FIG. 5B shows continuous generation of pressure which generates a continuous stream of fluid from the droplet generator.

The method of the present invention is shown in FIG. 1. Control 22 generates a trigger to actuate droplet forming means 18 to produce a liquid droplet 20 of precisely defined volume and surface area with precise velocity from the orifice. After a programmed delay, control 22 sends a trigger to a pressure source. The droplet 20 is accelerated by viscous drag to a velocity which makes its kinetic energy, when it strikes the substrate 12, large enough to overcome the droplet's surface tension (i.e., it satisfies equation (1)).

The result is a broken droplet 24 which wets the substrate 12 and spreads to an extent determined by energy balance in the droplet-surface-collision.

The puff of gas from the pressure source efficiently accelerates the droplet 20 toward the substrate 12 in part because the drag coefficient for small particles is inversely proportional to the Reynolds number of the flow. The flow velocity of the gas puff, and thus the velocity of droplet, are varied by adjusting the pressure generated, as well as the distance and orientation of the pressure source with respect to the substrate 12.

Thus, there are five variables which control the shape of the volume of fluid. These are: (1) timing and rate of fluid flow, (2) pressure from the fluid pump, (3) geometry of the orifices, (4) the location (distance) of the substrate, and (5) the type and amount of auxiliary excitation used. These variables are such that a continuous coating of liquid is formed on a substrate by arranging the velocity, volume, and surface area of the liquid volume so that the ratio shown in equation (1) is greater than 1 but does not result in splashing, rippling or other inhomogeneities.

$$\frac{\rho v^2 V}{2\sigma A} \geq 1 \tag{1}$$

For example, if the fluid generator uses an orifice and pressure such that a spherical droplet of fluid results, the volume to surface area: (V/A) equals r/3.

The energy which holds the droplet 20 in a spherical shape depends on the radius r of the droplet and the surface tension $\sigma$ of the liquid. The surface energy $E_s$ is the product of the surface tension and the surface area $4\pi r^2$. Thus, $$E_s = A\sigma = 4\pi \sigma r^2. \tag{2}$$

The kinetic energy $E_k$ of the drop is $mv^2/2$. The mass m is the density $\rho$ times the volume V. The kinetic energy of the drop is $E_k=\rho(4/3\pi r^3)v^2/2=4\pi\rho v^2 r^3/3$. Hence, the ratio of the kinetic energy to the surface energy is given by the equation:

$$\frac{E_{kinetic}}{E_{surface}} = \frac{\rho(4\pi r^3)v^2/6}{\sigma(4\pi r^2)} = \frac{\rho r v^2}{6\sigma} \geq 1 \quad (3)$$

By altering the velocity of the droplet, the kinetic energy is varied. Thus, when the ratio of $E_k/E_s=\rho v^2 r/6\sigma<1$, the energy is less than the energy required to hold the fluid together and the fluid bounces off of the substrate. In contrast, when the ratio of $E_k/E_s$ is very much greater than one, the excess kinetic energy must be dissipated by splashing of the solution or creating surface waves on the film. The mass flow rate is $$\frac{2\pi r^2 v \rho}{3}$$

per second.

Typical values for the minimum velocity required for droplets of several common solvents are shown in Table I. The table shows the velocity for which equation (1) is satisfied for spherical droplets with the radii of 1 μm, 50 μm and 100 μm.

TABLE I

| Liquid | σ (dyn/cm) | ρ (g/cm³) | ρ/(2σ) | r = 1 μm (cm/s) | 50 μm (cm/s) | 100 μm (cm/s) |
|---|---|---|---|---|---|---|
| acetic acid | 27.8 | 1.049 | .0189 | 1261 | 178 | 126 |
| acetone | 23.7 | .7899 | .0167 | 1342 | 190 | 134 |
| carbon tetrachloride | 26.95 | 1.594 | .0296 | 1007 | 142 | 101 |
| ethyl acetate | 23.9 | 0.902 | .0189 | 1261 | 178 | 126 |
| ethyl formate | 23.6 | 0.917 | .0194 | 1243 | 176 | 124 |
| glycerol | 63.4 | 1.251 | .0099 | 1743 | 247 | 174 |
| isopropanol | 21.7 | 0.785 | .0181 | 1288 | 182 | 129 |
| tetrachloroethylene | 31.7 | 1.623 | .0256 | 1083 | 153 | 108 |
| water | 73.1 | 1.00 | .0068 | 2094 | 297 | 209 |
| hexane | 18.4 | 0.66 | .0179 | 1293 | 183 | 129 |
| ethyl lactate | 29.9 | 1.042 | .0174 | 1312 | 186 | 131 |

In a further embodiment of the present invention, the predetermined volume of fluid which emerges from the generator is a continuous cylindrical jet of fluid which is directed towards the substrate in such a way that the kinetic energy per unit volume of fluid just exceeds the surface energy which holds the shape of the cylindrical jet. For a cylindrical jet:

$$E_k = \frac{\pi r^2 h v^2 \rho}{2} \quad (4)$$

$$E_s = (2\pi rh + 2\pi r^2)\sigma \quad (5)$$

Therefore, the ratio of $E_k/E_s$ is:

$$\frac{E_{kinetic}}{E_{surface}} = \frac{\rho(\pi r^2)(v^2)h/2}{\sigma(2\pi rh + 2\pi r^2)} = \frac{h\rho v^2}{4(h+r)\sigma} \geq 1 \quad (6)$$

wherein h is the height of a differential element of the cylinder. The mass flow rate is $\pi r^2 v \rho$.

The critical velocity for the breakup upon impact with the substrate for the continuous cylindrical jet is slightly less than and proportional to that required for a droplet of like radius:

cylindricaljet:$v \geq \sqrt{4\sigma/\rho r}$ sphericaldrop:$v \geq \sqrt{6\sigma/\rho r}$ $$\frac{v_{jet}}{v_{drop}} = \sqrt{2/3}$$

The cylindrical jet generated from the fluid generator may also be discontinuous, in which case the contribution of surface energy to the top and bottom of the cylindrical volume of fluid must be added to the denominator of equation (3). The detailed form of this contribution will depend on the actual curvature achieved at the ends of the cylindrical fluid volume and will be a small factor if the total height of the cylindrical volume h is much grater than its radius r.

Therefore, a cylindrical stream generated including hemispherical end-caps, with height h, radius r, velocity v, density $\rho$, and surface tension $\sigma$, the energies become:

$$E_k = \frac{[\pi r^2 h + 4/3\pi r^3]}{2} v^2 \rho \quad (10)$$

$$E_s = (2\pi rh + 4\pi r^2)\sigma \quad (11)$$

$$\frac{E_k}{E_s} = \frac{(rh + 4/3\pi r^2)v^2 \rho}{4(h+2r)\sigma} \quad (12)$$

The mass flow rate is:

$$M_r = \frac{(h+4r/3)}{(h+2r)} \pi r^2 v \rho \quad (13)$$

In a further embodiment of the invention, the volume of liquid generated is ellipsoidal and its radii $r_1$ and $r_2$ define the ratio of the surface area to volume in equation (1), to give an analogous expression for the critical velocity in terms of fluid density and surface tension.

The method of the present invention allows one to vary the volume V over a wide range while controlling the radius r so that conditions may be identified wherein the ratio of the equation is just enough greater than one to give uniform films. How much greater than one this ratio must be for successful film deposition depends on precisely how well the solution wets the substrate, a factor which depends intimately on many variables, such as surface roughness and chemical pretreatment. The essential point is that the invention permits detailed control of r and v of the droplets so that optimal conditions may be reproducibly identified for specific coating solutions and substrates.

The single coating element shown in FIG. 1 and described in the preceding paragraphs is generalized to a one dimensional housing array 30 of hybrid nozzles as shown, for example, in FIG. 4. An acceptable multi-orifice array is also shown and described in Lyon et al. U.S. Pat. No. 3,739,393, the disclosure of which is incorporated herein by reference. Individual piezoelectric drivers are employed for each liquid orifice 32 to achieve fine control for deposition of layers of solution with programmed film thickness variations. However, the preferred mode for photoresist application with this embodiment permits multiple orifices to be driven by a single pulsed driver. These orifices 32 may have any of the shapes shown in FIG. 2 to produce differing volume/surface area combinations.

Further, the method of the present invention can be performed by using a two dimensional array in much the same way as the one-dimensional array described above.

While the forms of apparatus and methods herein described constitute preferred embodiments of the invention, it is to be understood that the invention is not limited to these precise forms of apparatus, and that changes may be made therein without departing from the scope of the invention.

What is claimed is:

1. A method of coating a thin film on a substrate comprising the steps of:
   generating a volume of a fluid having a preset surface area;
   accelerating said volume of fluid by impacting said volume with a pressurized stream of a second fluid to a velocity, whereby said volume of fluid is accelerated in the direction of said substrate; and
   controlling a ratio of said volume to said surface area of said fluid such that said velocity of said volume of fluid at impact with said substrate results in wetting of said substrate with a film of said fluid but does not cause rippling, splashing or inhomogeneities in said film on said substrate wherein said velocity v, volume V and surface area A of said accelerated fluid are such that the ratio $$\frac{\rho v^2 V}{2\sigma A}$$

is greater than or equal to 1, wherein $\rho$ is the density of the fluid and $\sigma$ is the surface tension of the fluid.

2. The method of claim 1 further comprising the step of generating an auxiliary excitation during said acceleration step.

3. The method of claim 2 wherein said auxiliary excitation is caused by an ultrasonic source.

4. The method of claim 2 wherein said auxiliary excitation is caused by an electrostatic source.

5. The method of claim 2 wherein said auxiliary excitation is caused by a gas dynamic source.

6. The method of claim 1 wherein said step of generating a volume of fluid generates a cylindrical volume.

7. The method of claim 6 wherein said velocity v, volume and surface area of said fluid are such that a ratio shown in equation (2) is greater than or equal to 1

$$\frac{h\rho r v^2}{4(h+r)\sigma} \quad (2)$$

wherein $\rho$ is the density of the fluid, $\sigma$ is the surface tension of the fluid, r is the radius of the cylinder and h is the height of the cylinder.

8. The method of claim 6 wherein said cylindrical volume is continuous.

9. The method of claim 6 wherein said cylindrical volume is discontinuous.

10. The method of claim 1 wherein said step of generating a volume of fluid generates an ellipsoidal volume.

11. The method of claim 1 wherein the step of controlling includes the steps of controlling
   a timing of generating said volume of fluid;
   a pressure from a source of pressure;
   a geometry of a generating orifice;
   a distance of said substrate from said generator of said volume of fluid; and
   an auxiliary excitation.

12. A method of coating a thin film on a substrate comprising the steps of:
   simultaneously generating a plurality of volumes of fluid to coat said substrate;
   subsequent to said droplet generating step, generating a pressurized stream of a second fluid to contact said volumes of fluid, whereby said volumes of fluid are accelerated and propelled toward a substrate by said stream of fluid; and
   controlling a ratio of said volume to surface area of said volumes of said fluid such that said velocities of said volumes of fluid at impact with said substrate result in wetting of said substrate to form a film thereon but do not cause rippling, splashing or inhomogeneities in said film on said substrate wherein the volume V of fluid are accelerated at a ratio $$\frac{\rho v^2 V}{2\sigma A}$$

which is slightly greater than 1, where $\rho$ is the mass density of said fluid v is the velocity of said droplets, A is the surface area of said volumes of fluid and $\sigma$ is the surface tension of said fluid.

13. The method of claim 12 wherein said step of generating a pressure includes the step of providing auxiliary excitation.

14. The method of claim 12 wherein said step of generating a volume of fluid generates a cylindrical volume.

15. The method of claim 14 wherein said velocity v, volume and surface area of said fluid are such that the ratio $$\frac{h\rho r v^2}{4(h+r)\sigma}$$

is greater than or equal to 1, wherein $\rho$ is the density of the fluid, $\sigma$ is the surface tension of the fluid, r is the radius of the cylinder and h is the height of the cylinder.

16. The method of claim 14 wherein said cylindrical volume is continuous.

17. The method of claim 14 wherein said cylindrical volume is discontinuous.

18. The method of claim 12 wherein the step of controlling includes the steps of controlling
   a timing of generating said volume of fluid;
   a pressure from a source of pressure;
   a geometry of a generating orifice;
   a distance of said substrate from said generator of said volume of fluid; and
   an auxiliary excitation.

* * * * *